US012713671B2

(12) United States Patent
Pree et al.

(10) Patent No.: US 12,713,671 B2
(45) Date of Patent: Aug. 18, 2026

(54) TRANSISTOR DEVICE, SEMICONDUCTOR PACKAGE AND METHOD OF FABRICATING A TRANSISTOR DEVICE

(71) Applicant: Infineon Technologies Austria AG, Villach (AT)

(72) Inventors: Elias Pree, Villach (AT); Peter Lagger, Spittal/Drau (AT)

(73) Assignee: Infineon Technologies Austria AG, Villach (AT)

( * ) Notice: Subject to any disclaimer, the term of this patent is extended or adjusted under 35 U.S.C. 154(b) by 513 days.

(21) Appl. No.: 18/142,050

(22) Filed: May 2, 2023

(65) Prior Publication Data

US 2023/0369410 A1 Nov. 16, 2023

(30) Foreign Application Priority Data

May 13, 2022 (EP) .................................... 22173374

(51) Int. Cl.
*H10D 62/10* (2025.01)
*H10D 30/01* (2025.01)
(Continued)

(52) U.S. Cl.
CPC ....... *H10D 62/393* (2025.01); *H10D 30/0297* (2025.01); *H10D 30/668* (2025.01);
(Continued)

(58) Field of Classification Search
CPC ......... H01L 24/05; H01L 24/06; H01L 24/45; H01L 24/48; H01L 24/49;
(Continued)

(56) References Cited

U.S. PATENT DOCUMENTS 6,649,975 B2 * 11/2003 Baliga ........................... 257/330
8,946,876 B2 * 2/2015 Seto ........................ H01L 29/41
(Continued)

FOREIGN PATENT DOCUMENTS

JP H0563202 A 3/1993
JP 2004 55976 * 2/2004 ........... H10D 30/668
(Continued)

*Primary Examiner* — Wael M Fahmy
*Assistant Examiner* — Alice W Tang
(74) *Attorney, Agent, or Firm* — Murphy, Bilak & Homiller, PLLC

(57) ABSTRACT

A transistor device includes a semiconductor substrate having a first major surface and transistor cells formed therein. Each transistor cell includes a drift region of a first conductivity type, a body region of an opposing second conductivity type arranged on the drift region, a source region of the first conductivity type arranged on the body region, a columnar field plate trench extending into the first major surface and including a field plate, and a gate trench structure extending into the first major surface and including a gate electrode. A first metallization structure on the first major surface provides a first contact pad for wire bonding. At least one of depth and doping level of the body region is locally increased within the transistor cells located within one or more first areas of the first major surface. One or more of the first areas are located underneath the first contact pad.

15 Claims, 7 Drawing Sheets

(51) Int. Cl.
*H10D 30/66* (2025.01)
*H10D 62/17* (2025.01)
*H10D 64/00* (2025.01)
*H10W 72/00* (2026.01)
*H10W 72/50* (2026.01)
*H10W 72/59* (2026.01)
*H10W 72/90* (2026.01)
*H10W 90/00* (2026.01)

(52) U.S. Cl.
CPC ......... *H10D 62/127* (2025.01); *H10D 64/117* (2025.01); *H10W 72/07552* (2026.01); *H10W 72/07555* (2026.01); *H10W 72/527* (2026.01); *H10W 72/5438* (2026.01); *H10W 72/5449* (2026.01); *H10W 72/5473* (2026.01); *H10W 72/5475* (2026.01); *H10W 72/5522* (2026.01); *H10W 72/5524* (2026.01); *H10W 72/557* (2026.01); *H10W 72/932* (2026.01); *H10W 72/936* (2026.01); *H10W 90/755* (2026.01)

(58) Field of Classification Search
CPC . H01L 2224/04042; H01L 2224/05553; H01L 2224/0603; H01L 2224/06051; H01L 2224/45124; H01L 2224/45144; H01L 2224/48091; H01L 2224/48132; H01L 2224/48175; H01L 2224/48247; H01L 2224/4846; H01L 2224/4903; H01L 2224/49111; H01L 2224/49112; H01L 2224/49171; H01L 2224/49175; H01L 2224/49177; H01L 2224/49505; H01L 2224/73265; H01L 2924/00014; H10D 30/0297; H10D 30/668; H10D 62/10; H10D 62/106; H10D 62/127; H10D 62/393; H10D 64/112; H10D 64/117; H10W 72/07552; H10W 72/07554; H10W 72/07555; H10W 72/527; H10W 72/5438; H10W 72/5445; H10W 72/5449; H10W 72/5453; H10W 72/5473; H10W 72/5475
See application file for complete search history.

(56) References Cited

U.S. PATENT DOCUMENTS

| | | | | |
|---|---|---|---|---|
| 9,680,004 | B2 * | 6/2017 | Laforet et al. | H01L 29/7813 |
| 10,050,113 | B2 * | 8/2018 | Siemieniec et al. | H01L 29/407 |
| 10,262,926 | B2 * | 4/2019 | Lam et al. | H01L 23/49503 |
| 2012/0025263 | A1 | 2/2012 | Yamaguchi | |
| 2016/0013280 | A1 * | 1/2016 | Laforet et al. | H01L 29/407 |
| 2019/0355650 | A1 * | 11/2019 | Fan | H01L 23/49568 |

FOREIGN PATENT DOCUMENTS

| | | | | |
|---|---|---|---|---|
| JP | 2017 084839 | * | 5/2017 | H10D 30/668 |
| WO | 2021155943 A1 | | 8/2021 | |

* cited by examiner

14'
26
35
37
40
36
18
14
122
123
120
12
10
33
11
34

TRANSISTOR DEVICE, SEMICONDUCTOR PACKAGE AND METHOD OF FABRICATING A TRANSISTOR DEVICE

BACKGROUND

Common transistor devices for power applications include Si CoolMOS®, Si Power MOSFETs, and Si Insulated Gate Bipolar Transistors (IGBTs). U.S. Pat. No. 9,680,004 B2 discloses a power MOSFET including a metal gate electrode in a gate trench having a stripe shape. The power MOSFET also includes a field plate in a field plate trench which has a columnar or needle shape. The field plate provides charge compensation and offers an opportunity to reduce the area specific on resistance of the MOSFET device.

The transistor device is typically housed in a semiconductor package that includes a substrate or a leadframe and leads which are used to mount the package on a redistribution board such as a printed circuit board. The transistor device is mounted on the substrate or lead frame and internal electrical connections, e.g. bond wires, are used to electrically connect the transistor device to the leads of the package. The package may also include a plastic mold compound which covers the transistor device and the internal electrical connections.

Transistor devices and semiconductor packages having even better performance would be desirable.

SUMMARY

According to the invention, a transistor device is provided that comprises a semiconductor substrate comprising a first major surface and a plurality of transistor cells formed in the semiconductor substrate. Each transistor cell comprises a drift region of a first conductivity type, a body region of a second conductivity type arranged on the drift region, the second conductivity type opposing the first conductivity type, a source region of the first conductivity type arranged on the body region, a columnar field plate trench extending into the first major surface of the semiconductor substrate and comprising a field plate, and a gate trench structure extending into the first major surface of the semiconductor substrate and comprising a gate electrode. A first metallization structure is arranged on the first major surface of the semiconductor substrate. The first metallization structure provides a first contact pad for wire bonding. At least one of the depth and doping level of the body region is locally increased within the transistor cells located within one or more first areas of the first major surface of the semiconductor substrate. One or more of the first areas are located underneath the first contact pad.

At least one of the depth and doping level of the body region is locally increased within individual ones of the plurality of transistor cells that are located within the one or more first areas compared to the depth and doping level of the body region in individual ones of the transistor cells outside of these one or more first areas. The transistor cells in the one or more first areas are therefore distinguishable from the remainder of the transistor cells of the plurality of transistor cells. If two or more first areas are provided, within which the transistor cells have a body region with a local increase of at least one of the depth and doping level, these two or more first areas are spaced apart by transistor cells which do not have a local increase in at least one of depth and doping level of the body region.

The plurality of transistor cells, both in and outside of the first areas, are active transistor cells that include a body region, source region and gate electrode. The plurality of transistor cells forms the active cell field of the transistor device. The active cell field is typically laterally surrounded by an edge termination region that is devoid of active transistor cells. The active cell field can be considered to have two types of area. The one or more first areas and a second area that is outside of the one or more first areas. The plurality of transistor cells can be considered to include two subsets, a first subset being arranged in the first area(s) and a second subset being arranged in the second area, where the first and second subset of transistor cells have different structures of the body region.

The transistor device may be a vertical transistor device with a vertical drift path that extends substantially perpendicular to the first major surface. Transistor device may be a MOSFET, in particular a power MOSFET. The first contact pad is positioned on the active cell field and may be a load contact pad, for example the source pad.

For each transistor cell in the first area or first areas, within which at least one of the depth and doping level of the body region is locally increased, the at least one of the depth and the doping level of the body region varies within that individual transistor cell.

Typically, the columnar field plate trenches are arranged in a regular array, for example a square grid array formed by rows and columns or a hexagonal array formed by staggered rows or columns, and have the same spacing or pitch. The gate trench structure is typically elongate or stripe-like and may have a grid-form that laterally surrounds each of the columnar field plate trenches to form an individual transistor cell. The individual transistor cells can be considered to have "corners" formed by the intersections of the grid-like gate trench structure and grid-like gate electrode in the gate trench structure.

In some embodiments, in the transistor cells in the first area or area, the depth and/or doping level of the body region is increased at the corners of the transistor cell compared to the regions of the cell between the corners. Each cell can be considered to include corner FETs and straight FETs, one straight FET being positioned laterally between two corner FETs. As the threshold voltage VGSTH depends on the depth and doping level of the body region, the threshold voltage VGSTH varies within the transistor cell, and in particular is greater in the portions with a greater body region depth and/or higher body region doping level.

The one or more first areas, within which at least one of the depth and doping level of the body region is locally increased, are positioned underneath the area or lateral extent of the first contact pad. Additionally, these one or more first areas may be positioned underneath a subarea of the first contact pad onto which a connector such as a bond wire, is intended to be attached. This subarea can be considered to be a bonding area of the first contact pad. Attachment of the connector has been observed to lead to VGSTH drift of the transistor cells located under the attachment area. This drift is thought to be the result of a local reduction of VGSTH in the transistor cells under the attachment area of the bond wire. By locally increasing the threshold voltage VGSTH of the transistor cells positioned under the bonding area, i.e. the first subset of transistor cells located in the first area, this local area decrease in VGSTH can be compensated so that VGSTH of the entire plurality of transistor cells, after the connector is attached, for example after bond wiring, is more uniform across the transistor device.

According to embodiments described herein, a more uniform threshold voltage (VGSTH) after the connector(s) are attached to the first contact pad is achieved by locally tuning the threshold voltage within the transistor cell(s) underneath the attachment area of the connector onto the first contact pad. This can be achieved, for example, by locally increasing the doping level of the body region at the intersections of the grid-like gate structure, so as to locally increase the VGSTH of the corner MOSFET and mitigate the effects of the two-dimensional electric field at the corner of the transistor cell, i.e. at the intersection of the gate trench sections.

In some embodiments, in the first area or first areas only and, therefore, in the first subset of the plurality of transistor cells, a second body ("corner body") is introduced into the transistor structure only in the corners, i.e. at the intersections of the gate trenches. This enables the VGSTH of the corner and straight MOSFETs of the individual transistor cells in the first area(s) to be tuned separately. Furthermore, the additional corner body enables the length of the accumulation region in the gate crossings to be tuned separately.

The second body implantation can be detected using Scanning Electron Microscopy (SEM) to examine a cross-sectional view of the cell field in a sample that has been subjected to a decoration etch. and transfer characterization measurements. The needle field plate trench design and grid-like gate design can be seen in a top view, Furthermore, the variation in the doping level of the body region can be detected with SSRM (Scanning Spreading Resistance Microscopy) or methods for the characterization of the doping profile of the MOSFET cell, such as SIMS (Secondary Ion Mass Spectroscopy).

Since the field plate trench is columnar in shape, it is deeper than it is wide, i.e. has a greater depth perpendicular to the first major surface than its longest dimension parallel to the first major surface. The field plate within the trench may also be columnar. However, the lateral shape of the columnar field plate may differ from the lateral shape of the columnar field plate trench. For example, the columnar field plate trench may be hexagonal in top view and the field plate circular in top view. The field plate within the field plate trench is electrically insulated from the semiconductor substrate by an electrically insulating layer that lines the sidewalls and base of the columnar field plate trench. The electrically insulating layer may be formed of silicon oxide. The base of the columnar field plate trenches may be tapered, rounded or substantially flat.

In some embodiments, at least one of the depth and doping level of the body region is locally increased solely within the transistor cells located within one or more first areas of the first major surface of the semiconductor substrate. These one or more first areas, in which at least one of the depth and doping level of the body region is locally increased, may be located in a pre-determined position that is underneath and covered by the first contact pad. These one or more pre-determined first areas may be located underneath a region of the first contact pad onto which a connector, such as a bond wire, is to be attached, for example to electrically connect the first contact pad to a lead of the semiconductor package in which the transistor device is to be housed.

In some embodiments, the first metallization layer includes one or more further contact pads. The first contact pad may be a source contact pad and a further contact pad may be a gate pad. Optionally, the first metallization layer may include one or more auxiliary contact pads such as a source sense pad.

The transistor device also has a second major surface opposing the first major surface. A drain region is typically formed at the second major surface to form a vertical transistor device with a vertical drift path. A second contact pad may be positioned on the second major surface which is connected to the drain region. The transistor device may be a MOSFET (Metal Oxide Semiconductor Field Effect Transistor) device so that the first contact pad is a source pad and the second contact pad a drain pad.

In some embodiments, the vertical transistor device is an insulated gate bipolar transistor (IGBT) device or a Bipolar Junction Transistor (BJT).

The electrodes or terminals of the transistor device referred to herein as source, drain and gate. also encompass the functionally equivalent terminals of other types of transistor devices, such as an insulated gate bipolar transistor (IGBT). For example, as used herein, the term "source" encompasses not only a source of a MOSFET device and of a superjunction device but also an emitter of an insulator gate bipolar transistor (IGBT) device and an emitter of a Bipolar Junction Transistor (BJT) device, the term "drain" encompasses not only a drain of a MOSFET device or of a superjunction device but also a collector of an insulator gate bipolar transistor (IGBT) device and a collector of a BJT device, and the term "gate" encompasses not only a gate of a MOSFET device or of a superjunction device but also a gate of an insulator gate bipolar transistor (IGBT) device and a base of a BJT device.

In some embodiments, the gate trench structure comprises a first section extending in a first lateral direction and a second section extending in a second lateral direction that is different from the first lateral direction, wherein the second section intersects with the first section at an intersection. The first and second sections are elongate or stripe-like and have a longest dimension that extends parallel to the first surface.

In some embodiments, the columnar field plate trenches are arranged in a regular array throughout the cell field, i.e. in the one or more first areas and the second area. The columnar field plate trenches may be arranged in a square grid array or a hexagonal array, for example. In these embodiments, the first section of the gate trench structure is arranged between adjacent ones of the columnar field plate trenches and the second section of the gate trench structure is arranged between adjacent ones of the columnar plate trenches, wherein the gate trench structure comprises a grid structure formed by a plurality of first sections intersecting a plurality of second sections and forming a plurality of intersections. The gate electrode positioned in the gate trench structure has the same basic form as the gate trench structure, e.g. has a grid structure.

In some embodiments, in the one or more first areas of the first major surface, the depth of the body region is greater at the intersection of the gate trench structure than in a region bounding the columnar field plate trench and/or the doping level of the body region is higher at the intersection of the gate trench structure than in a region bounding the columnar field plate trench.

In some embodiments, in the individual ones of the transistor cells located in the one or more first areas of the first major surface, a maximum net dopant concentration of the semiconductor substrate at a position adjacent a side wall of the intersection of the gate trench structure is at least 1.1 times and at most twenty times a maximum net dopant concentration of the semiconductor substrate at a position adjacent the columnar field plate trench.

In some embodiments, in the individual ones of the transistor cells arranged in the second area of the first major surface of the semiconductor substrate and laterally adjacent and outside of the one or more first areas, a maximum net dopant concentration of the semiconductor substrate at a position adjacent a side wall of the intersection of the gate trench structure lies within the range of 0.9 times and 1.09 times a maximum net dopant concentration of the semiconductor substrate at a position adjacent the columnar field plate trench.

The depth of the body region in the region of the intersection is $t_{int}$ and the depth of the body region adjacent the columnar field plate trench is $t_{body}$, and the doping level of the body region in the region of the intersection is $D_{int}$ and the doping level of the body region adjacent the columnar field plate trench is $D_{body}$. In some embodiments, in the one or more first areas $t_{int} \geq t_{body}$ and/or $D_{int} > 1.1\ D_{body}$ and in the second area of the first major surface of the semiconductor substrate outside of the one or more first areas $0.95t_{body} < t_{int} < 1.04t_{body}$ and/or $0.9D_{body} < D_{int} < 1.09D_{body}$. In some embodiments, in the one or more first areas $t_{int} > 1.05t_{body}$ and/or $D_{int} > 1.1\ D_{body}$ and in the second area of the first major surface of the semiconductor substrate outside of the one or more first areas $0.95t_{body} < t_{int} < 1.04t_{body}$ and/or $0.9D_{body} < D_{int} < 1.09D_{body}$.

In some embodiments, in the individual ones of the transistor cells arranged in the one or more first areas, the body region comprises a higher doping level in a region adjacent the intersection than in a region positioned between neighbouring two intersections, and/or the body region comprises a higher doping level in a region adjacent the intersection than in a region adjacent the columnar field plate trench.

In some embodiments in addition to or in place of the body region comprises a higher doping level in a region adjacent the intersection than in a region positioned between neighbouring two intersections, and/or the body region comprises a higher doping level in a region adjacent the intersection than in a region adjacent the columnar field plate trench in the individual ones of the transistor cells arranged in the one or more first areas, the body region extends deeper into the semiconductor substrate at the intersection than in a region positioned between two neighbouring intersections, and/or the body region extends deeper into the semiconductor substrate adjacent the intersection than in a region positioned adjacent the columnar field plate trench in the individual ones of the transistor cells arranged in the one or more first areas.

A semiconductor package is also provided that comprises a conductive redistribution substrate comprising a die pad and a plurality of leads spaced apart from the die pad and the transistor device of any one of the embodiments described herein. The transistor device has a second major surface opposing the first major surface and the second major surface is mounted on the die pad. The first contact pad on the first major surface of the transistor device is electrically connected to at least one of the leads of the conductive redistribution structure by a bond wire. The bond wire is bonded to the contact pad at a first position that is located vertically above one of the first areas of the transistor device.

In some embodiments, the bond wire is further bonded to the first contact pad at a second position, for example by a stitch bond, and the second position is located vertically above a further one of the first areas of the transistor device.

In some embodiments, the first contact pad is a source pad and the first metallization structure on the first major surface further comprises a gate pad that is electrically coupled to one of the plurality of leads and the second major surface comprises a drain pad that is electrically connected to the die pad. In some embodiments, the first metallization structure further comprises one or more auxiliary pads which are electrically connected to an auxiliary structure integrated within the transistor device. For example, the transistor device may comprise a source sense functionality and the first metallization comprise a source sense pad.

According to the invention, a method of fabricating a transistor device is provided. The method comprises providing a semiconductor substrate comprising a first conductivity type and a first major surface, a plurality of columnar field plate trenches extending into the first major surface, the columnar field trenches each comprising a field plate, and a gate trench structure comprising an elongate gate trench having a length, the elongate gate trench extending into the first major surface of the semiconductor substrate and comprising a gate electrode. The method further comprises implanting dopants of a second conductivity type into the first major surface of the semiconductor substrate to form a body region in the semiconductor substrate, wherein the second conductivity type opposes the first conductivity type. In one or more first areas of the first major surface only, dopants of the second conductivity type are implanted into subregions of the first major surface of the semiconductor substrate within the one or more first areas so that at least one of the depth and doping level of the body region is increased in the subregion and so that at least one of the depth and doping level of the body region varies laterally within the first area. The method continues by implanting dopants of the first conductivity type into the first major surface of the semiconductor substrate and forming a source region on the body region and forming a metallization structure on the first major surface that includes a first contact pad for wire bonding. The first contact pad is positioned vertically above the one or more first areas.

The method includes a first body implant that is implanted over at least the entire active cell field or in some embodiments throughout the active cell field and the edge termination region that laterally surrounds the active cell field. A second body implant is carried out at selected areas only within the cell field. The method also includes a second body implant that is implanted into particular subregions of the individual ones of the transistor cells located in first area(s).

In some embodiments, the body region is formed first in the semiconductor substrate and then the dopants of the second conductivity type are implanted into the subregions of the body region located in the first area. In other embodiments, these processes are reversed so that the dopants of the second conductivity type are implanted into the subregions of the semiconductor substrate located in the first area(s) and then the body region is implanted into the semiconductor substrate and into the subregions.

In some embodiments, the method further comprises, after implanting the dopants of the second conductivity type into the first area(s) and after formation of the body region, annealing the semiconductor substrate. In some embodiments, the method further comprises annealing the semiconductor substrate after forming the source region.

In some embodiments, the gate trench structure comprises a first section extending in a first lateral direction and a second section extending in a second lateral direction that is different from the first lateral direction, wherein the second section intersects with the first section at an intersection. In the first area, the subregion, in which at least one of the depth and doping level of the body region is increased, is arranged at the intersection. The second body implant is selectively carried out solely at the intersections of the transistor cells that are positioned in the first area(s).

In some embodiments, the individual ones of the plurality of columnar field plate trenches are arranged in a regular array, and the gate trench structure comprises a grid structure formed by a plurality of first sections intersecting a plurality of second sections to form a plurality of intersections, wherein the gate electrode has a grid structure and a pair of first sections and a pair of second sections laterally surround the plurality of columnar field plate trenches. Within the first area, the subregions, in which at least one of the depth and doping level of the body region is increased, are arranged at the intersections so that at least one of the depth and doping level of the body region varies laterally between the columnar field plate trench and the intersection of the gate trench structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1A:
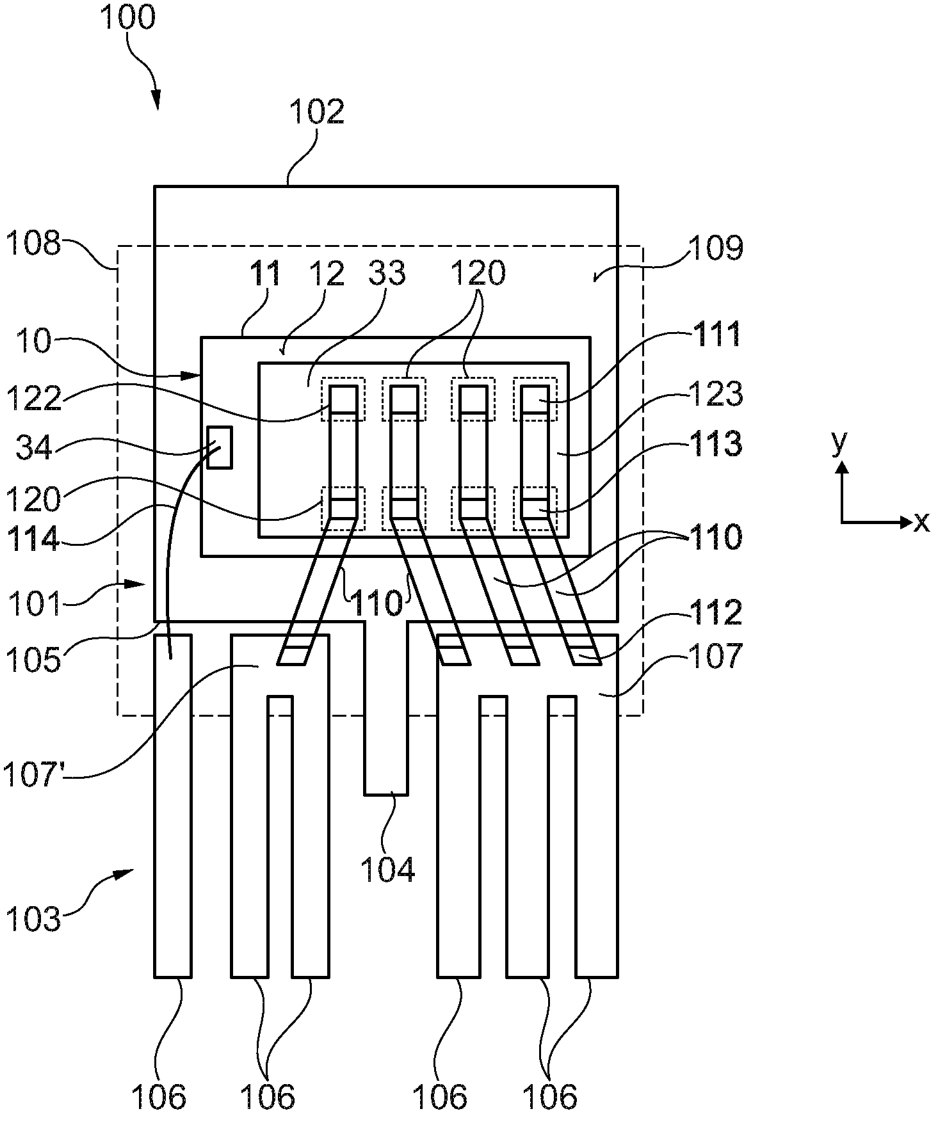
FIG. 1A illustrates a top view of a semiconductor package including a transistor device.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As used herein, various device types and/or doped semiconductor regions may be identified as being of n type or p type, but this is merely for convenience of description and not intended to be limiting, and such identification may be replaced by the more general description of being of a "first conductivity type" or a "second, opposite conductivity type" where the first type may be either n or p type and the second type then is either p or n type.

The figures illustrate relative doping concentrations by indicating "−" or "+" next to the doping type "n" or "p". For example, "n-" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Negative threshold voltage (VGSTH) drift has been observed for semiconductor packages including a transistor device with include columnar or needle-shaped field plates and a gate grid structure, for example after tests on TO (transistor outline) packages in which the contact pads on upper surface of the transistor device is connected to the pins or leads with wire bonds. This threshold voltage drift is thought to be due to an interaction of the wire bond process with the gate corners of the grid structure, which are thought to be more vulnerable to mechanical stress from the wire bonding process than a line gate trench.

It is proposed to mitigate or even prevent the drift of the threshold voltage that is thought to originate from the area under wire bond area by introducing a body implant at the gate corners (corner body). This corner body implantation dose is in such a high regime that overcompensation of the threshold voltage is achieved. This may lead to a degradation of the RON (on-state resistance) in this area. Therefore, this corner body implant is used solely at the areas directly under the wire bonds to reduce the negative impact on performance, negative impact on SOA (safe operating area), and higher VGSTH variation. Low VGSTH drift after long use of the product comparable to SON packages (<100 mV) is achieved. The additional corner body implant can be detected using Scanning Spreading Resistance Microscopy parallel to the gate trench between source contact and gate trench.

FIGS. 1A to 1G illustrate various views of a semiconductor package 100 and a transistor device 10. The transistor device 10 may be included in the semiconductor package 100 or in another type of semiconductor package.

FIG. 1A illustrates a top view of the semiconductor package 100. The package 100 comprises a conductive redistribution substrate 101 in the form of a leadframe which includes a die pad 102 and a plurality of leads 103. At least one of the plurality of leads 103 is spaced apart from the die pad 102. The die pad 102 and the plurality of leads 103 may be provided by a lead frame which is, for example, formed from a metal such as copper.

In the semiconductor package 100 illustrated in FIG. 1A, seven leads 103 are provided on a first side 105 of the die pad 102. The central one of the seven leads 104 is integral with and extends from the first side 105 of the die pad 102 and six leads 106 are arranged adjacent and spaced apart from the first side 105 of the die pad 102. In this embodiment, three of the leads 106 arranged on one side of the central lead 104 and their respective inner ends are connected to one another by a connection region 107 which serves as an enlarged bonding area. Two of the leads 106 arranged on the opposing side of the central lead 104 and adjacent one another and their inner ends are also connected to one another by a connection region 107' which provides an enlarged bonding area. The final lead 106 is a single lead. The die pad 102 is at least partly covered by a mold compound 108 which also covers the bonding areas 107, 107' of the plurality of leads 103. The distal ends of the plurality of leads 106 protrude from the mold compound 108 and provide the external contacts for the semiconductor package 100.

In some embodiments, the semiconductor package 100 is a surface mount package and the leads 103 protrude from the lower surface of the mold compound 108 rather than from intermediate a side wall of the mold compound 108. In some embodiments at least one side of the die pad 102, for example the side opposing the plurality of leads 103, protrudes from and is uncovered by the mold compound 108 and provides a further contact area. In some embodiments the rear side of the die pad 102 is expose from the mold compound 108 and provides a contact area. The semiconductor package 100 is not limited to this design and may include fewer or more than seven leads depending on the package design. The package may conform to a JEDEC (Joint Electron Device Engineering Council) standard.

Figure 1B:
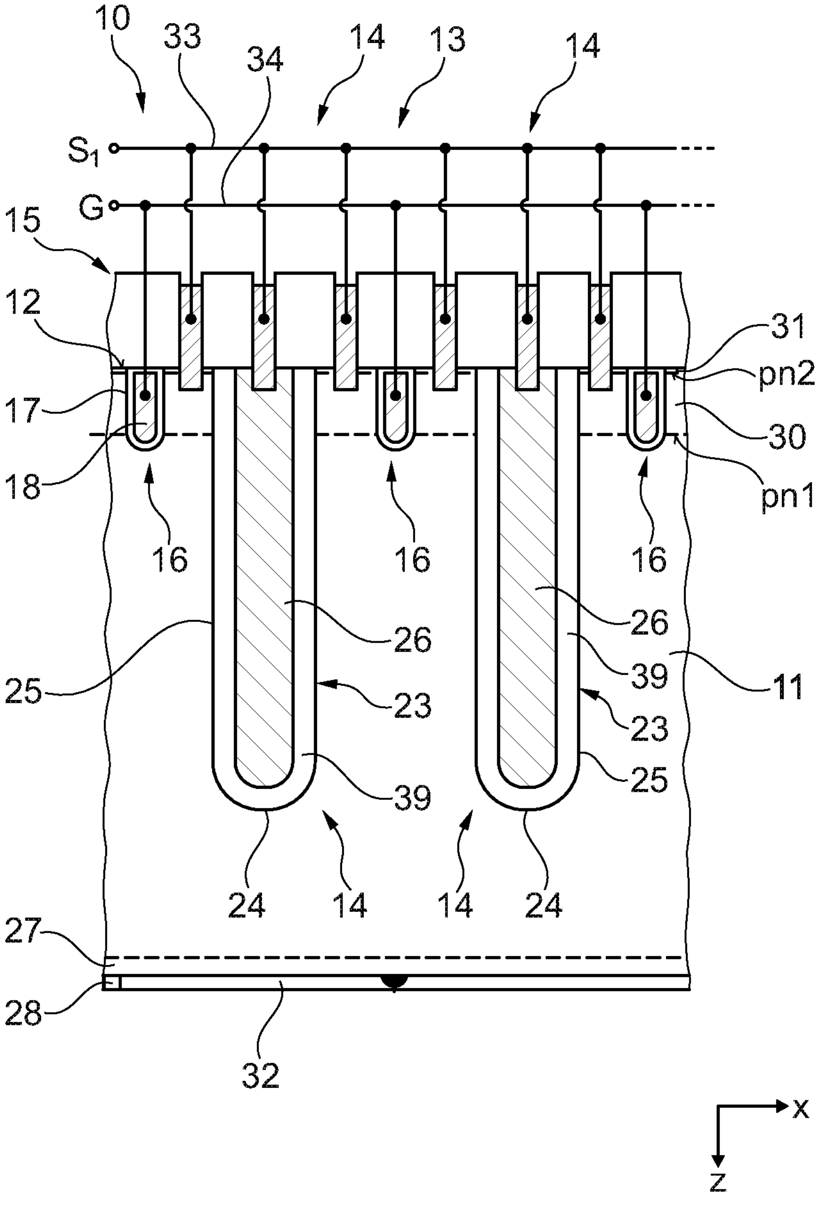
FIG. 1B illustrates a cross-sectional view of the transistor device of FIG. 1A.

The transistor device 10 is mounted on the upper surface 109 of the die pad 102. Referring also to FIGS. 1B and 10 which illustrate a cross-sectional view and an enlarged top view of the transistor device 10, the transistor device 10 includes a semiconductor substrate 11 having a first major surface 12 and a second major surface 28 which opposes the first major surface 12. The transistor device 10 may be a vertical power MOSFET or vertical IGBT, for example.

The second major surface 28 of the transistor device 10 is mounted on and electrically coupled to the upper surface 109 of the die pad 102. The first major surface 12 faces upwards and includes a first metallization layer structured to provide a first contact pad 33 and a second contact pad 34. The first contact pad 33 may be a source pad and the second contact pad 34 a gate pad of the transistor device 10. The drain pad 32 which can be seen in the cross-sectional view of FIG. 1B, is arranged on the second surface major surface 28 and electrically coupled to the die pad 102 and the central lead 104 which is integral with the die pad 102.

The first contact pad 33 is electrically connected to at least one of leads 106 which are spaced apart from the die pad 102 by one or more bond wires 110. In some embodiments, each bond wire 110 has a first end portion which is attached to the first contact pad 33 at a first attachment area 111 and a second end which is attached to the bonding area 107 of one or more the leads 106. In some embodiments, a plurality of bond wires 110 can be used. Each bond wire 110 therefore has a first attachment area 111 which is positioned on the first contact pad 33 and a lead attachment area 112 which is positioned on the connection areas 107, 107' of the leads 106.

The individual ones of the wire bonds 110 may have may be formed of an aluminium wire and have a larger diameter than the bond wire 114 which is used to electrically couple the gate pad 34 to the gate lead. The gate bond wire 114 may be formed of gold, for example.

In some embodiments, each bond wire 110 may be attached at more than one position to the contact pad 33. FIG. 1A illustrates an embodiment in which each of the bond wires 110 has first end which is attached to the contact pad 33 in the first attachment area 111 and is also attached to the contact pad 33 at a second attachment area 113 which is intermediate the length of the bond wire 110. The bond wire 110 then extends from the second attachment area 113 to one of the connection areas 107, 107' of the leads 106. This intermediate connection formed at the attachment area 113 is often referred to as a stitch bond.

In the embodiment illustrated in FIG. 1A, four bond wires 110 are used to electrically connect the first contact pad 33 to the plurality of leads 106, whereby three bond wires 110 extend between the contact pad 33 and the connection region 107 and one bond wire extends between the contact pad 33 and the connection region 107'. However, other types of arrangements and numbers of bond wires and may be used. It is also possible that each bond wire 110 includes more than one stitch bond intermediate its length which is connected to the first contact pad 33.

The first major surface 12 of the transistor device 10, in particular the cell field of the transistor device 10, can be considered to have different types of area, at least one first area 122 that is positioned under one of the attachment areas 111, 113 of the bond wire 110 and a second area 123 that is positioned laterally outside of the attachment areas 111, 113 and that is not positioned underneath and attachment area for bond wire 110.

Figure 1C:
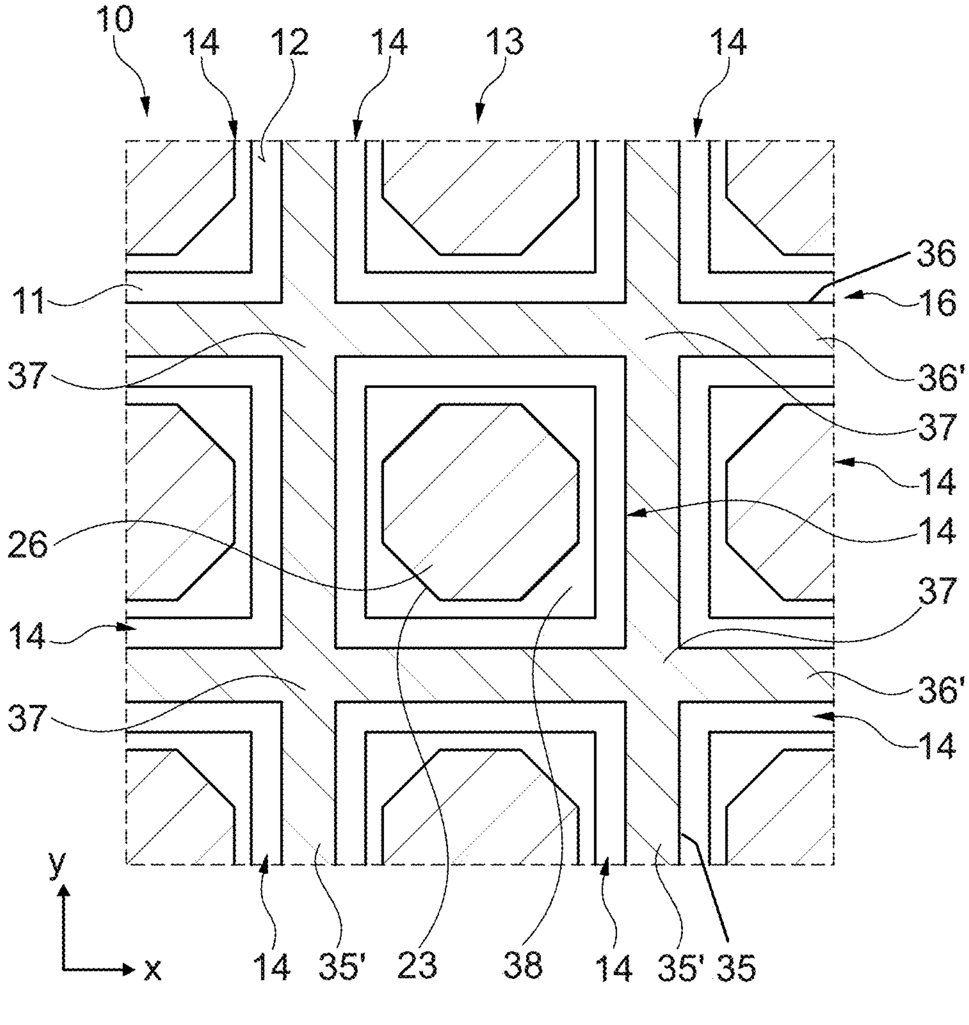
FIG. 1C illustrates a top view of transistor cells of the transistor device of FIG. 1B.
Figures 1D, 1E, 1F:
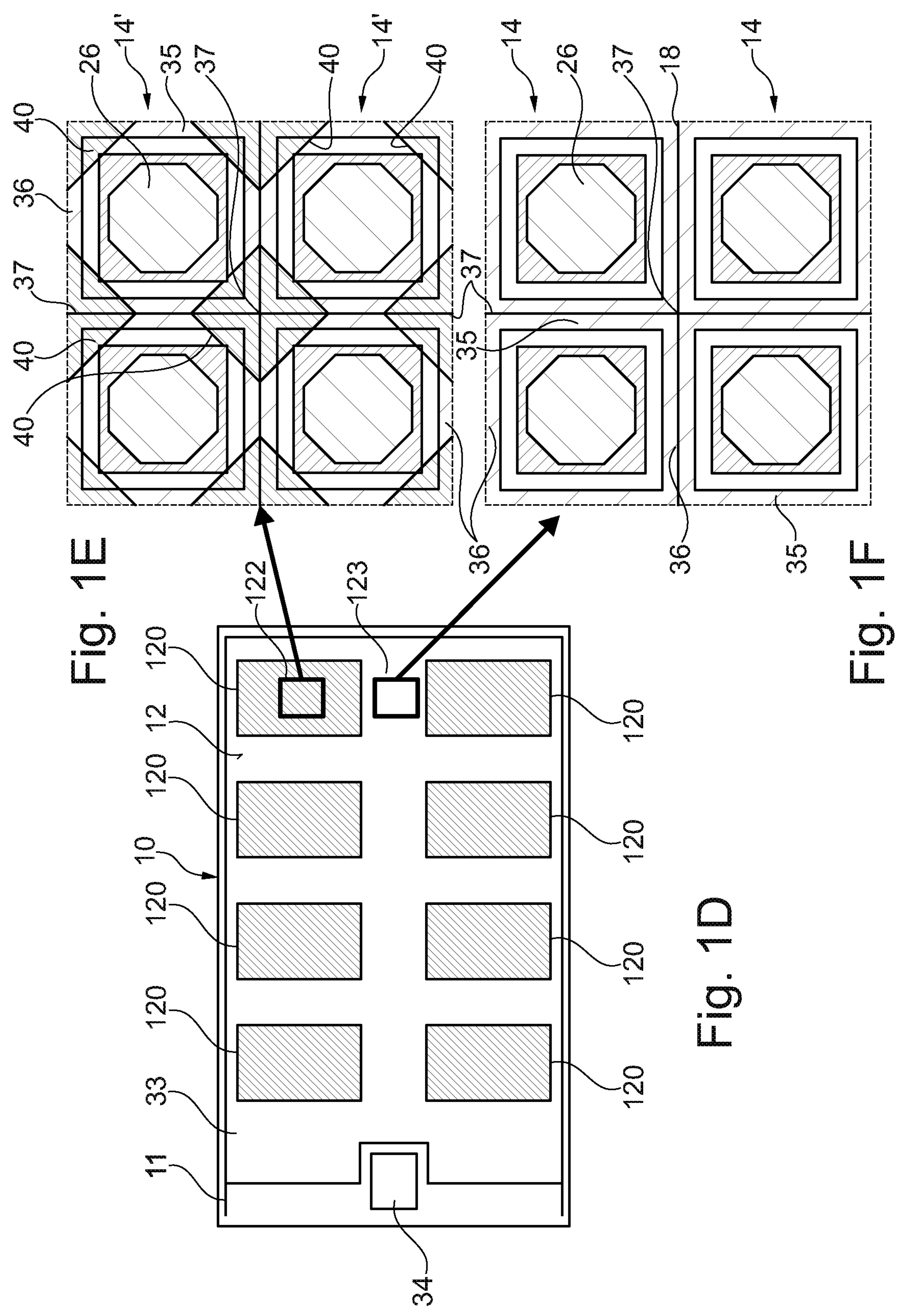
FIG. 1D illustrates a top view of the transistor device of FIG. 1A before attachment of the bond wires.
FIG. 1E illustrates a top view of the transistor cells in a first area of the transistor device of FIG. 1D.
FIG. 1F illustrates a top view of the transistor cells in a second area of the transistor device of FIG. 1D.

Referring to FIG. 1D, which illustrates a top view of the first major surface of the transistor device 10 without the bond wires 110 attached, typically, the contact pad 33 has one or more predetermined areas 120, which are provided for the attachment of a bond wire, either an end of the bond wire or a stitch bond. These areas 120 may be discernible by the provision of an outermost finishing layer which is formed of a material selected to promote good bonding and a good electrical connection between the material of the bond wire 110 and the underlying material of the contact pad 33. The first areas 122 of the transistor device 10 lie underneath the designated bonding areas 120 of the contact pad 33 and, therefore, under the attachment areas 111, 113 of the bond wires 110 to the bonding area 120.

FIG. 1B illustrates a cross-sectional view of the transistor cells 14 of the transistor device 10 of FIG. 1A in the second area 123 and FIG. 10 illustrates a top view of the transistor cells 14 in the second area 123 of the transistor device of FIG. 1B.

The transistor device 10 includes a semiconductor substrate 11 having a major surface 12, a cell field 13 comprising a plurality of active transistor cells 14 and an edge termination region 15 which laterally surrounds the cell field 13. The cell field 13 contributes to the switching of the transistor device 10, whereas the edge termination region 15 serves to provide electrical isolation between the active device region, i.e. the cell field 13, and the side faces of the device 10.

It has been observed that breakdown of the transistor device 10 sometimes begins in the first areas 122 of the transistor device 10 which are positioned underneath the attachment areas 111, 113 and later in the second area 123 which is laterally adjacent the attachment areas 111, 113. It is thought that this observation may be the result of these first areas 122 of the transistor device 10 having a threshold voltage VGSTH1 which is slightly less than the threshold voltage VGSTH2 of the second area 123 of the transistor device 10 that positioned laterally at adjacent to the attachment areas 111, 113. Therefore, the individual cells 14' of the transistor device 10 which are located under the attachment areas 111, 113 have a threshold voltage VGSTH1 which is less than the threshold voltage VGSTH2 of the transistor cells 14 positioned laterally adjacent to the attachment areas 111, 113.

The invention proposes to provide those transistor cells 14' which are positioned under the attachment areas 111, 113 and in the first areas 122 of the cell field 13 with a higher threshold voltage than the transistor cells 14 which are positioned laterally adjacent the attachment areas 111, 113 in the second area 123 of the cell field 13 in order to mitigate and even compensate for the apparent decrease in the threshold voltage observed for the transistor cells 14' under the attachment areas 111, 113 of the bond wires 110 in the first area 122 compared to the transistor cells 14 in the second area 123 of the cell field 13

It is proposed herein to achieve this local increase of the threshold voltage within the transistor cells 14' positioned in the first areas 122 of the transistor device 10 by increasing at least one of the depth and doping level of the body region within these transistor cells 14'. One discrete first area 122 is positioned under the individual ones of the attachment areas 111, 113 and laterally surrounded by the second area 123. Furthermore, it is proposed that at least one of the depth and doping level of the body region 30 is locally increased within the individual ones of the transistor cells 14' which are located within the first areas 122. That is, within the individual ones of the transistor cells 14' arranged under the attachment areas 111, 113, the body region 30 has a depth and/or doping level which is higher in some regions of that transistor cell 14' than the depth and/or doping level of the body region 30 in other regions of that individual transistor cell 14'.

For the transistor cells 14 located in the second area 123 laterally adjacent to the attachment areas 111, 113, the depth and doping level of the body region 30 is substantially uniform throughout the individual ones of the transistor cells 14 as well as between the transistor cells 14. As used herein, substantially uniform means within the typical unavoidable variations arising from processing conditions.

The plurality of transistor cells 14 in the cell field 13 are divided into two groups, the first group of transistor cells 14' being arranged in the first areas 122 under each of the attachment regions 111, 113 and the second group of transistor cells 14 being arranged laterally adjacent the first areas 122 in the second area 123.

FIG. 1B illustrates a cross-sectional view of the transistor cells 14 transistor device of FIG. 1A in the second area 123 and FIG. 10 illustrates a top view of the transistor cells 14 in the second area 123 of the transistor device of FIG. 1B.

Referring to the cross-sectional view of FIG. 1B, the cell field 13 comprises a gate trench structure including plurality of gate trenches 16 in the major surface 12 of the semiconductor substrate 11, each gate trench 16 comprising a gate dielectric 17 lining the gate trench 16 and an electrically conductive gate electrode 18 arranged in the gate trench and on the gate dielectric 17. The gate trenches 16 and gate electrode 18 are elongate and have a longest direction that extends parallel to the first major surface 12 into the plane of the drawing and have a depth that is less than the length. The gate electrodes 18 may be formed of polysilicon or metal.

The transistor device 10 further comprises a charge compensation structure which comprises a plurality of electrically conductive field plates 26, each field plate 26 being positioned in a field plate trench 23. The field plate trenches 23 extend into the major surface 12 of the semiconductor substrate 11 and are defined by a base 24 and sidewalls 25 which extend substantially perpendicular to the major surface 12. The field plate 26 is electrically conductive and may be formed of polysilicon, for example. The field plate trench 23 is lined with an electrically insulating layer 39, which is commonly known as a field oxide, to electrically isolate the electrically conductive field plate 26 from the semiconductor substrate 11. The field oxide 39 typically has a larger thickness than the gate dielectric 17.

The semiconductor substrate 11 may be formed of a monocrystalline semiconductor body such as a monocrystalline silicon wafer. In some embodiments, the semiconductor body may be formed by epitaxial semiconductor layer, for example an epitaxial silicon layer.

The transistor device 10 is a vertical transistor device with a drain region 27 positioned at a second major surface 28 of the semiconductor body which opposes the major surface 12. The semiconductor substrate 11 may form the drift region 29 of the transistor device 10 and be lightly doped with a first conductivity type, e.g. n-type. The drain region 27 is highly doped with the first conductivity type, for example n-type. A body region 30 is positioned on the drift region 29 and the comprises dopants of a second conductivity type, e.g. p-type, which opposes first conductivity type. A source region 31 is positioned on or in the body region and comprises dopants of a first conductivity type.

A drain pad 32 is positioned on the second major surface 28 and is electrically connected to the drain region 27 to form a drain contact for the transistor device 10 on the rear surface 28. A first metallization structure is arranged on the first major surface 12 of the semiconductor substrate 11 on the cell field 13 which includes a source pad 33 which is electrically coupled to the source region 31 and the field plates 26 which forms a source contact for the transistor device 10 and a gate pad 34 which is electrically coupled to the gate electrodes 18. The gate pad 34 is positioned on the major surface 12 laterally adjacent source contact.

FIG. 10 illustrates a top view of a portion of the transistor device 10. In the top view, it can be seen that each of the field plate trenches 23 and the field plates 26 is columnar and has a needle shape that is deeper than it is wide. In this embodiment, the field plate trenches 23 are shown as having an octagonal outer contour. However, the outer contour is not limited to this form shape and may have other shapes, such as circular, square, hexagonal and so on. The columnar field plate trenches 23 and consequently the field plate 26 positioned within them are arranged in a regular square grid array of rows and columns. However, the array is not limited to a square grid array and other arrays such as a hexagonal array may be used.

In the top view of FIG. 10, it can also be seen that the gate trenches 16 and the gate electrodes 18 form part of a grid shape so that the transistor device 10 includes a gate trench structure having longitudinal sections 35 extending in the Y direction and transverse sections 36 extending in the X direction. The longitudinal sections 35 and transverse sections 36 cross or intersect one another at intersections 37. The gate electrode 18 also has a grid form including longitudinal sections 35' extending in the Y direction and transverse sections 36' extending in the X direction that intersect one another at intersections 37'. Each intersection 37 is positioned at the corner of four adjoining transistor cells 14.

In the embodiment illustrated in FIG. 10, the spacing between neighbouring longitudinal sections 35 and the spacing between neighbouring transverse sections 36 is substantially the same such that a square grid is formed. One columnar field plate trench 23 and its associated columnar field plate 26 is positioned in each of the square regions bounded by and spaced apart from two neighbouring longitudinal sections 35 and two neighbouring transverse sections 36 of the grid-like gate trench 16. The intersections 37 are also arranged in a regular array of rows and columns.

Also illustrated in FIG. 1C is the position of a contact 38 which is positioned on the field plate 26 and which is laterally spaced apart from the grid of the gate trench 16.

Figure 1G:
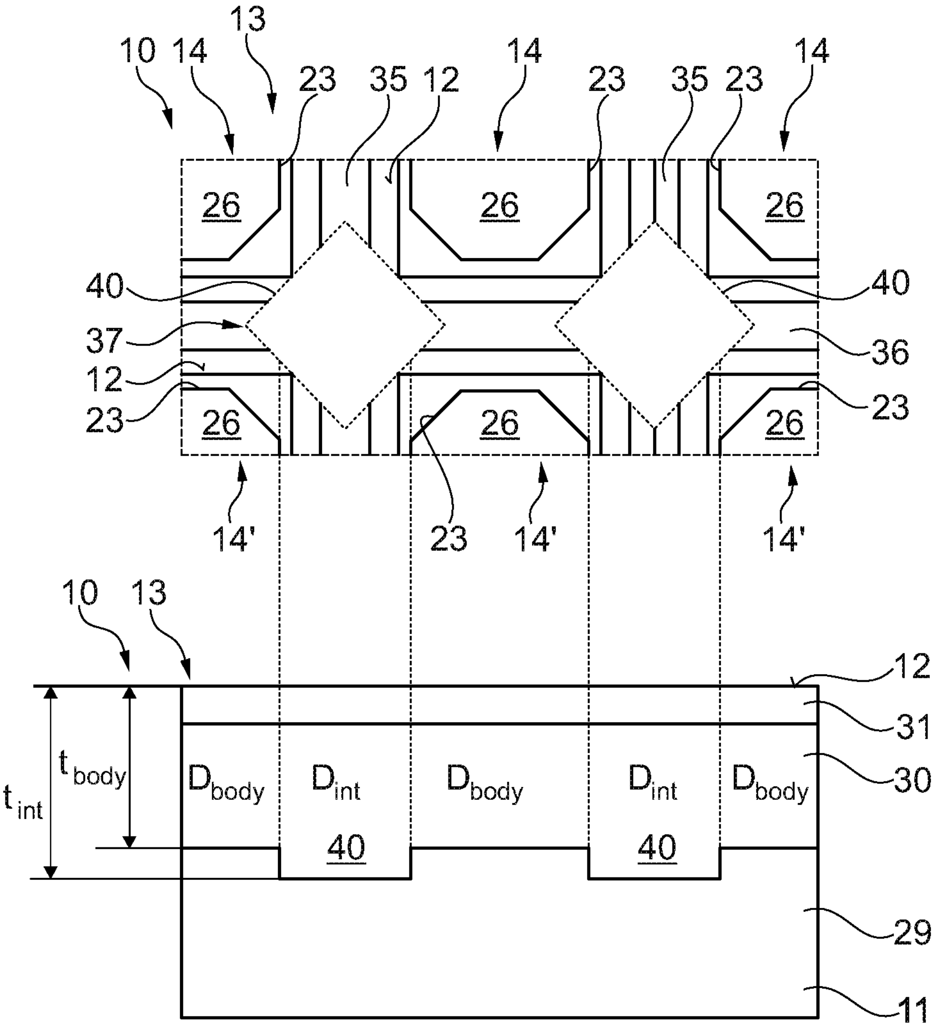
FIG. 1G illustrates a cross-sectional view of the transistor cells in the first area of the transistor device of FIG. 1E.

FIG. 1D illustrates a top view of the first major surface 12 of the transistor device 10 of FIG. 1A before attachment of the bond wires 110 to electrically connect the source pad 33 to the leads 106 of the package so that the first and second areas 122, 123 and designated bonding areas 120 can be better seen. FIG. 1E illustrates a top view of the transistor device 10 in a first area 122 and in particular a top view of the transistor cells 14' in the first area 122 of the transistor device 10 which is located under a bonding area 120. FIG. 1G illustrates a cross-sectional view of the transistor device 10 of FIG. 1E and a cross-sectional view of the transistor cells 14' in the first area 122 under the bonding area 120. For comparison, FIG. 1F illustrates a top view of the transistor device 10 and the transistor cells 14 in the second area 123 which is laterally adjacent the first area 122 and which is to remain laterally outside of the attachment areas 111, 113 of the bond wires 110.

In the transistor cells 14' in the first area 122 located under the attachment areas 111, 113 of the bond wire 110 and the source pad 33, a local decrease of the threshold voltage of the transistor cell 14 is thought to occur in the region adjacent and bounded by the perpendicular corner of the gate structure formed at the intersection 37 compared to the threshold voltage of other parts of the transistor cell 14, for example adjacent the field plate trench 23 or adjacent portion of the longitudinal section 35 or transverse section 36 positioned midway between two immediately neighbouring intersections 37. It is thought that the intersections 37 are more sensitive to mechanical pressure, for example arising from the wire bonding process, than regions laterally intermediate the intersections 37. This effect can be mitigated by locally tuning the threshold voltage VGSTH within the area of the transistor cell 14, i.e. VGSTH has different values at different positions within the transistor cell 14, for example at different positions within the region enclosed by a ring of the gate trench grid.

Therefore, the body region 30 has a different structure in the transistor cells 14' in the first areas 122 that are to be positioned under the bond wires attached to the contact pad 33 in the bonding areas 120 compared to the structure of the body region 30 of the transistor cells 14 in the second area 123 which is laterally adjacent to the attachment regions 120.

At least one parameter of the body region 30, for example doping level and/or depth, is locally increased within the area of the individual ones of the transistor cells 14' in the first area 122. In some embodiments, the body region 30 of the transistor cells 14' in the first areas 122 includes at least one parameter having a value that varies depending on the lateral position within the transistor device 10 and also on its lateral position within each transistor cell 14'.

In some embodiments, in the transistor cells 14' in the first area 122 the depth t of the body region 30 and/or a doping level D of the body region 30 varies as a function of its lateral position. The maximum variation in the doping level D of the body region 30 can be around twenty times. The variation may be a minimum of 1.1 times. By locally tuning the doping level D and/or depth t of the body region 30 within the transistor cell 14', the threshold voltage can be locally tuned within the cell 14' so that the threshold voltage is more uniform and early turn on of the transistor device 10 can be avoided.

FIG. 1E illustrates a top view of the portion of the cell field 13 in the first area 122 including the transistor cells 14' in which regions 40 of the body region 30 are schematically indicated which have a value of a parameter which differs from the value of this parameter outside of the indicated regions 40. In the embodiment illustrated in FIG. 1E, the doping level of the body region 30 within the regions 40, $D_{int}$, is higher than the doping level of the body region 30 laterally outside of the regions 40, $D_{body}$. For example, $D_{int}>1.1\ D_{body}$ or $D_{int}>1.2D_{body}$.

Each of the regions 40 is arranged at an intersection 37 between a longitudinal gate trench section 35 and a transverse gate trench section 36. The regions 40 are each depicted as a square shape with the corners aligned with the gate grid, i.e. a longitudinal gate section 35 or a transverse gate section 36, and represent the lithography mask that is used for the implantation. Each region 40 has a lateral extent such at it extends from the inner edge of the gate trench section 35, 36 in the immediate vicinity of the intersection 37 towards the field plate trench 23 by a distance. This results in the threshold voltage being locally increased within the region 40 compared to outside of the region 40 so that the effect of the electric field extending from two perpendicular directions at the corner of the transistor cell 14' formed at the intersection 37 by the longitudinal section 35 and transverse section 36 of the gate trench 16 can be mitigated.

In the embodiment illustrated in FIG. 1E, since the regions 40 are depicted by illustrating the lithographic mask which is used for the implantation, each of the regions 40 is depicted as a discrete region spaced apart from its neighbouring discrete regions 40 such that the discrete regions 40 are arranged in a regular array of rows and columns. However, in the transistor device 10, the variation in the value of the parameter, e. g. doping level of the body region 30, in lateral directions may not be abrupt and have a more gradual change as a function of distance.

The columnar field plate trenches 23 and the columnar field plates 26 are arranged in a regular square grid array. The regions 40 are also arranged in a regular square array that has the same pitch but that that is laterally offset from the square grid array of the field plate trenches 23.

The region 40 as depicted in the drawings may correspond to the opening in a mask used for locally implanting additional dopants into the body region 30. In these embodiments, the discrete regions 40 may indicate a region in which a second body implant to implant dopants of the second conductivity type is performed so that the doping level of the body region 30 at and around the intersections 37 between the longitudinal gate trench sections 37 and transverse gate trench sections 36 is locally increased.

The doping level of the body region 30 varies as a function of the lateral position within each transistor cell 14' in the first area 122, for example in a lateral direction between the field plate trench 23 to the gate trench 16, in particular to the intersection 37 of the gate trench 16 of that transistor cell 14.

The regions 40 in the transistor cells 14' are depicted in FIG. 1E as having the form of a square with the corners of the square aligned with the centre of the longitudinal sections 35 and transverse sections of the gate trench structure 16. However, the region 40 is not limited to having this particular shape. Further examples are illustrated in FIGS. 2A to 2E.

In the first areas 122 of the transistor device 10, the doping level of the body region 30 at the intersection 37 of the gate trench structure 16 differs from the doping level of the body region 30 at the columnar field trench 23. For example, the doping level of the body region 30 may be higher at in a portion of the semiconductor substrate 11 positioned immediately adjacent the intersection 37 than in a portion of the semiconductor body positioned immediately adjacent the columnar field trench 23.

FIG. 1G illustrates a top view and a cross-sectional view of a portion of the first area 122 and indicates a lateral variation in the depth of the body zone 30 in the transistor cells 14' in one of the first areas 122.

In some embodiments, within the transistor cells 14' of the first area, the depth, $t_{int}$, of the body region 30 from the major surface 12 of the semiconductor substrate 11 in the region 40 differs from the depth, $t_{body}$, of the body region 30 that bounds the columnar field trench 23. For example, the depth of the body region immediately adjacent the intersection 37 may be greater than the depth of the body region immediately adjacent the columnar field plate trench 23.

The depth of the body region 30 can also be defined as the position of the pn junction between the body junction 30 and the drift region 29.

In some embodiments, within each transistor cell 14' in the first area 122, a maximum net dopant concentration of the semiconductor substrate 11 at a position adjacent a side wall of the intersection 37 of the gate trench 16 is at least 1.1 and at most ten times a maximum net dopant concentration of the semiconductor substrate 11 at a position adjacent a side wall of the columnar field plate trench 23.

In some embodiments, within each transistor cell 14' in the first area 122, a maximum net dopant concentration of the semiconductor substrate 11 at a position adjacent the gate dielectric 17 positioned on the side wall of the gate trench 16 forming the side wall of the intersection 37 is at least 1.1 times or at least 1.2 times and at most ten times a maximum net dopant concentration of the semiconductor substrate 11 at a position adjacent the field oxide 39 positioned the side wall 25 of the columnar field plate trench 23.

In some embodiments, within each transistor cell 14' in the first area 122 and in a plane of the semiconductor substrate 11, a maximum net dopant concentration of the semiconductor substrate 11 at a position adjacent a side wall of the intersection 37 of the gate trench 16 is at least 1.1 times or at least 1.2 times and at most ten times a maximum net dopant concentration of the semiconductor substrate 11 at a position adjacent a side wall of the columnar field plate trench 23.

In some embodiments, within each transistor cell 14' in the first area 122 and in a plane of the semiconductor substrate 11, a maximum net dopant concentration of the semiconductor substrate 11 at a position adjacent the gate dielectric 17 positioned on the side wall of the gate trench 16 forming the side wall of the intersection 37 is at least 1.1 times or at least 1.2 times and at most ten times a maximum net dopant concentration of the semiconductor substrate 11 at a position adjacent the field oxide 39 positioned the side wall 25 of the columnar field plate trench 23.

In some embodiments, within each transistor cell 14' in the first area 122 and in a plane of the semiconductor substrate 11 that is positioned between the major surface 12 of the semiconductor substrate 11 and the depth $t_{body}$, the maximum net dopant concentration of the semiconductor substrate 11 at a lateral position adjacent the side wall of the intersection 37 of the gate trench 16 is at least 1.1 times or at least 1.2 times and at most twenty times the maximum net dopant concentration of the semiconductor substrate 11 at the lateral position adjacent the side wall of the columnar field plate trench 23.

In some embodiments, within each transistor cell 14' in the first area 122 and in a plane of the semiconductor substrate 11 that is positioned between the major surface 12 of the semiconductor substrate 11 and the depth $t_{body}$, a maximum net dopant concentration of the semiconductor substrate 11 at a position adjacent the gate dielectric 17 positioned on the side wall of the gate trench 16 forming the side wall of the intersection 37 is at least 1.1 times or at least 1.2 times and at most ten times a maximum net dopant concentration of the semiconductor substrate 11 at a position adjacent the field oxide 39 positioned the side wall 25 of the columnar field plate trench 23.

For the transistor cells 14' in the first areas 122, the variation in the level of the parameter of the body region 30 in one or more lateral directions and/or the vertical direction may be periodic and correspond to the periodic arrangement of the intersections 37. For example, the regions 40 may be arranged in a regular array corresponding to the regular array of intersections 40.

In some embodiments, at least one of the depth and doping level of the body region 30 in the transistor cells 14' varies laterally with a predetermined pattern, for example has a laterally regular variation in value, across the first area 122 of the transistor device 10.

In some embodiments, such as illustrated in FIGS. 1A to 1G, the regions 40 and intersections 37 are arranged in rows and columns to form a square grid array. In these embodiments, in the transistor cells 14' at least one of the depth and doping level of the body region 30 varies with a regular pitch along the rows and columns of the square grid array. In some embodiments, the regions 40 and intersections 37 are arranged in a hexagonal array.

In some embodiments, the transistor device may be fabricated using the following method. A semiconductor substrate comprising a first conductivity type and a first major surface, a plurality of columnar field plate trenches extending into the first major surface and a gate trench structure is provided. The columnar field trenches each comprise a field plate. The gate trench structure comprises an elongate gate trench having a length and extending into the first major surface of the semiconductor substrate and comprising a gate electrode. The method continues by implanting dopants of a second conductivity type into the first major surface of the semiconductor substrate to form a body region in the semiconductor substrate, wherein the second conductivity type opposes the first conductivity type. In one or more first areas of the first major surface only, dopants of the second conductivity type are implanted into subregions of the first major surface of the semiconductor substrate within the one or more first areas so that at least one of the depth and doping level of the body region is increased in the subregion and so that at least one of the depth and doping level of the body region varies laterally within the first area. The method then continues by implanting dopants of the first conductivity type into the first major surface of the semiconductor substrate and forming a source region on the body region and forming a metallization structure on the first major surface that includes a first contact pad for wire bonding. The first contact pad is positioned vertically above the first area.

In order to provide increased doping levels in the body region 30 at predetermined regions of the semiconductor substrate 11, a two-stage process may be used in which dopants comprising the second conductivity type are implanted into the major surface 12 of the semiconductor substrate 11 uniformly and then a second implantation process is used to implant further dopants of the second conductivity type into subregions of the major surface 12 of the semiconductor substrate 11. A body drive, or annealing treatment, may be carried out after the first implantation and before the second implantation or after the first and the second implantation or only after the second implantation.

In some embodiments, a first implant process is used to form the body region 30 in the semiconductor substrate 11 over the entire area of the cell field 13 for both the transistor cells 14' in the first area 122 and the transistor cells 14 in the second area 123 that has a substantially uniform doping level. This first implant process can be carried out first followed by a local or area selective implantation in regions of the transistor cells 14' in the first area 122 using a second implant process so as to increase the doping level of the body region 30 at preselected regions 40, which are to correspond to the position of the intersections 37 of the gate trench structure 16 of the transistor cells 14' in the first area 122.

Alternatively, these two implant processes may be carried in in the reverse order so that in the first implant process, a local or area selective implantation in carried out in the first area 122 so as to increase the doping level of the body region 30 at preselected regions 40, which are to correspond to the position of the intersections 37 of the gate trench structure 16 of the transistor cells 14' in the first area 122 and in a second implant process, the body region 30 in the semiconductor substrate 11 over the entire area of the cell field 13 for both the transistor cells 14' in the first area 122 and the transistor cells 14 in the second area 123 that has a substantially uniform doping level.

FIGS. 2A to 2E illustrate of alternative embodiments for the body region 30 in the transistor cells 14' in the first area 122 of the transistor device 10 of FIGS. 1A to 1G.

FIGS. 2A to 2E illustrate top vies of transistor cells 14' in the first area 122 and portions of a gate grid structure including a region 40 of the body region 30 positioned at the intersection 37, that has a different value of a parameter, for example a higher doping level, than at regions of the body region 30 positioned laterally adjacent this region according to various embodiments.

In FIGS. 2A to 2D The gate grid structure includes a plurality of longitudinal sections 35 extending substantially parallel to one another and a plurality of transverse sections 36 extending substantially parallel to one another and intersecting one another at intersections 37 to form a square grid arrangement for the gate trench 16 and gate electrode 18. In FIG. 2E, the gate structure has intersections 37 between gate sections that intersect at an angle other than 90°.

Figures 2A, 2B, 2C, 2D:
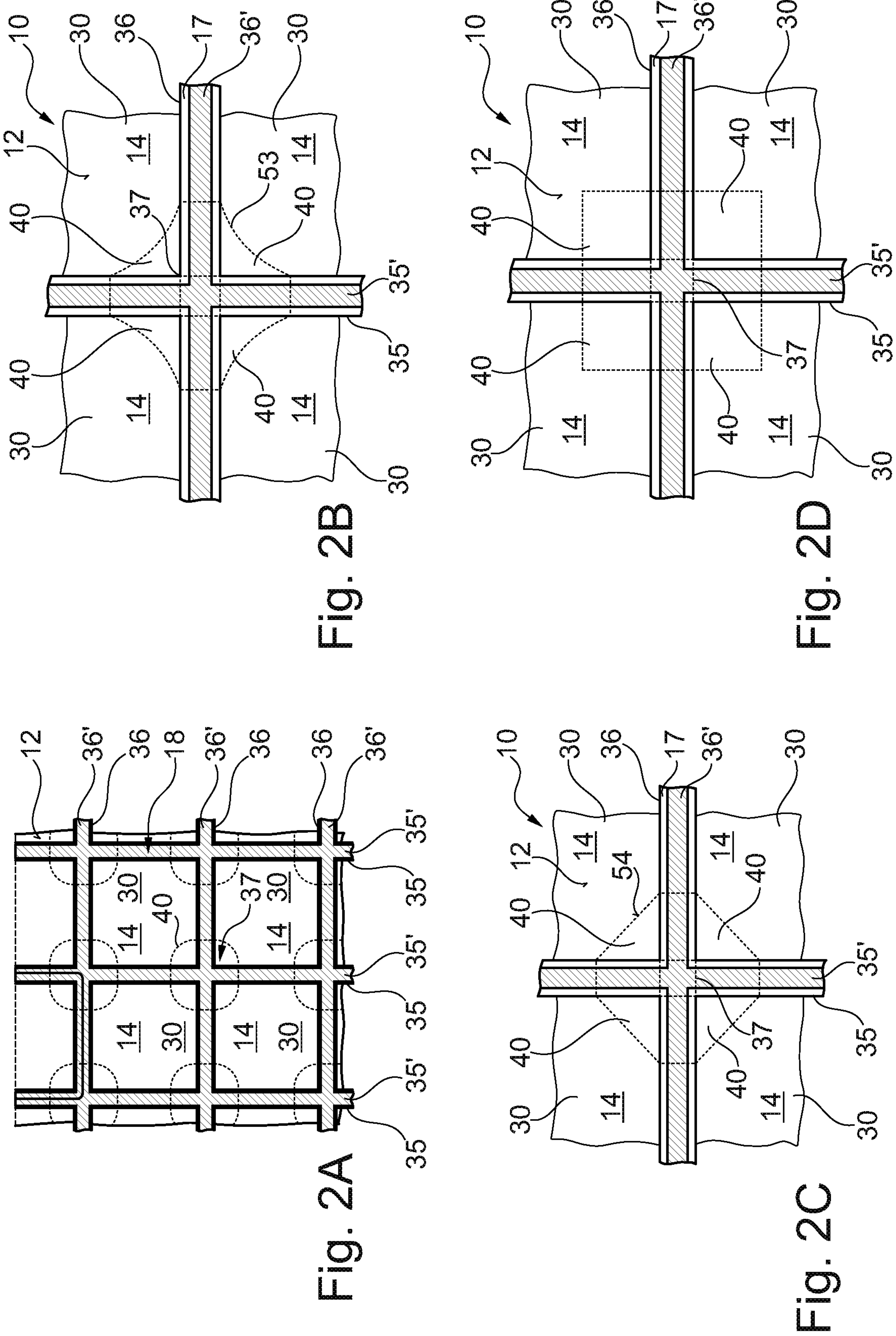
FIGS. 2A to 2E illustrate alternative embodiments of transistor cells in the first area of the transistor device of FIGS. 1A to 1G.
Figure 2E:
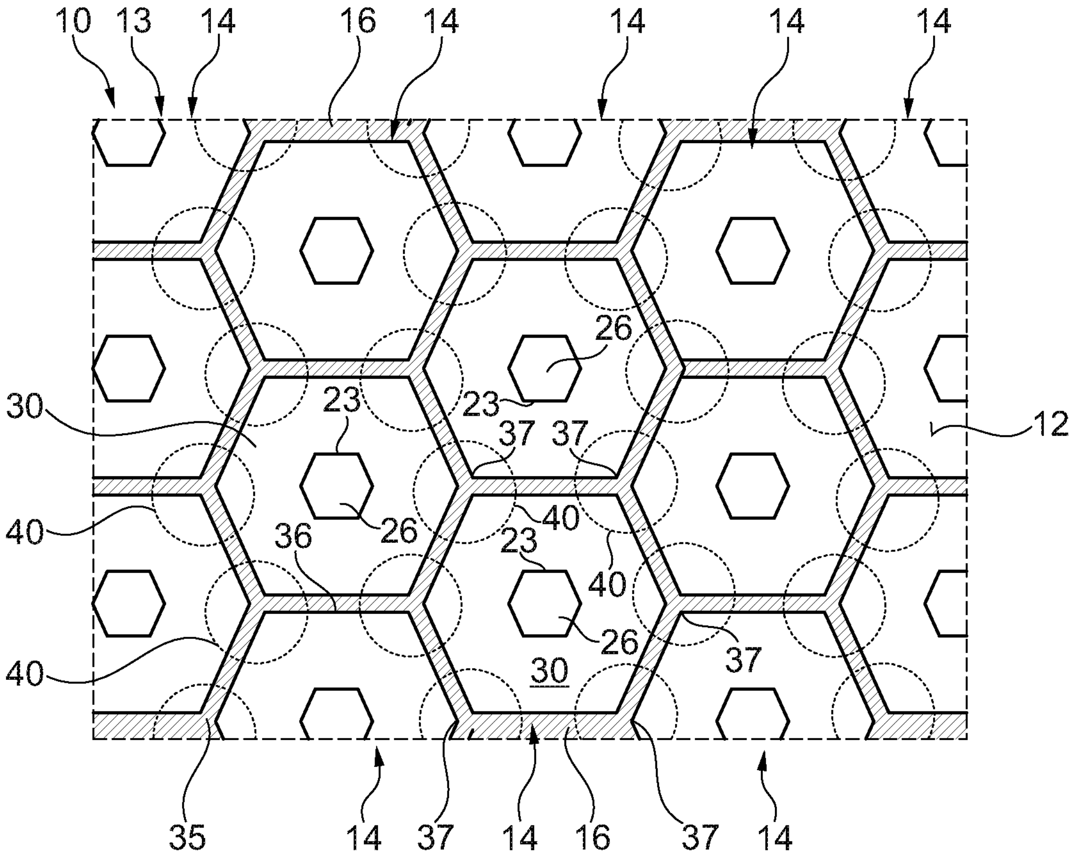

In the embodiment illustrated in FIG. 2A, the transistor cells 14' in the first area 122 include regions 40 of the body region 30 which have a substantially square shape with rounded corners, whereby the rounded corners are positioned in the body region 30 of the four transistor cells 14' such that the rounded corners point towards the columnar field plate trench (not seen in the view of FIG. 2A) at the centre of each of the four transistor cells 14'.

FIG. 2B illustrates an embodiment of transistor cells 14' in the first area 122 in which the region 40 with a higher doping level extends symmetrically around the intersection 37 between the orthogonal longitudinal and transverse sections 35, 36 and has an outer contour such that the contour between intersecting sections 35, 36 bounding a transistor cell 14' is concave 53. This results in the lateral extent of the doped region 40 being greater in directions parallel to the longitudinal and transverse sections 35, 36 of the gate structure than in directions extending from the corner 51, that is formed between adjacent longitudinal and transverse sections 35, 36, in the direction of the columnar field plate trench at the centre of the transistor cell 14'. The gate electrode 18 also has a grid form including longitudinal sections 35' extending in the Y direction and transverse sections 36' extending in the X direction that intersect one another at intersections 37'. Each intersection 37 is positioned at the corner of four adjoining transistor cells 14.

In some non-illustrated embodiments, for the transistor cells 14' which are positioned at the edge of the cell field 13, a first longitudinal trench section 35 extends from one sidewall of a second transverse trench section 35 so as to form a T-shape. In this embodiment a longitudinal section 35 extends from one side wall of a transverse section 36 with the opposing side wall of the transverse section 36 being straight. In this embodiment, the doped region 40 may be arranged so as to extend between the two adjoining sidewalls of the longitudinal section 35 and transverse section 36 and not on the opposing straight sidewall of transverse section 36.

FIG. 2C illustrates an embodiment of transistor cells 14' in the first area 122 in which the contour of the body region 40 which extends between the intersecting sidewalls of a connected transverse trench section 36 longitudinal trench section 35 is substantially linear 54 rather than concave as illustrated in FIG. 2C.

FIG. 2D illustrates an embodiment of transistor cells 14' in which the body region 40 has a substantially square form, with the corners being positioned in the body region 30 rather than being aligned with the longitudinal and transverse trench sections 35, 36.

In a non-illustrated embodiment, in the transistor cells 14' in the first area 122, the region 40 has a cross form such that it extends from the sidewalls of the intersecting longitudinal and transverse sections 35, 36 by a uniform distance WS, or is substantially circular and is aligned symmetrically with the intersection 37 formed between a connected longitudinal section 35 and transverse section 36.

FIG. 2E illustrates an embodiment in which the gate gride structure is hexagonal and includes a plurality of first sections 35 and a plurality of second sections 36, whereby the first and second sections 35, 36 intersect one another at an angle $\alpha$ of around 120° to form the intersections 37 and form a gate trench 16 having a hexagonal form in plan view. The gate electrode 18 also has a hexagonal form in plan view.

In the transistor cells 14' in the first area 122, a region 40 that has a different value of a parameter, for example a higher doping level, is arranged at each of the intersections 37 so that the regions 40 have a hexagonal arrangement in plan view. Each region 40 may be arranged substantially symmetrically about the intersection 37. In this embodiment, each region 40 has a substantially circular form in plan view. However, each region 40 may also have other forms, for example hexagonal or triangular. Each region 40 extends into three adjoining transistor cells 14, each of which can be considered to have a hexagonal shape in plan view.

Each transistor cell 14 in the second area 123 as well as each transistor cell 14' in the first area 122 includes a columnar field plate trench 23 and field plate 26. The columnar field plate trench 23 and columnar field plate 26 may also have a hexagonal shape in plan view. However, the field plate trench 23 and field plate may have other forms, for example be substantially circular in plan view.

The columnar field plate trenches 23 and the columnar field plates 26 are arranged in a hexagonal array. The regions 40 are also arranged in a hexagonal array that has the same pitch but that is laterally offset from the hexagonal array of the field plate trenches 23.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor device, comprising:

a semiconductor substrate comprising a first major surface and a plurality of transistor cells formed in the semiconductor substrate, wherein each transistor cell comprises:

a drift region of a first conductivity type;

a body region of a second conductivity type arranged on the drift region, the second conductivity type opposing the first conductivity type;

a source region of the first conductivity type arranged on the body region;

a columnar field plate trench extending into the first major surface of the semiconductor substrate and comprising a field plate; and a gate trench structure extending into the first major surface of the semiconductor substrate and comprising a gate electrode; and a first metallization structure arranged on the first major surface and that provides a first contact pad for wire bonding, wherein at least one of a depth and a doping level of the body region is locally increased within the transistor cells located within one or more first areas of the first major surface of the semiconductor substrate, wherein one or more of the first areas are located underneath the first contact pad.

2. The transistor device of claim 1, wherein the gate trench structure comprises a first section extending in a first lateral direction and a second section extending in a second lateral direction that is different from the first lateral direction, wherein the second section intersects with the first section at an intersection, wherein in the one or more first areas of the first major surface, the depth of the body region is greater at the intersection of the gate trench structure than in a region bounding the columnar field plate trench and/or the doping level of the body region is higher at the intersection of the gate trench structure than in a region bounding the columnar field plate trench.

3. The transistor device of claim 2, wherein in the one or more first areas of the first major surface, a maximum net dopant concentration of the semiconductor substrate at a position adjacent a side wall of the intersection of the gate trench structure is at least 1.1 times and at most twenty times a maximum net dopant concentration of the semiconductor substrate at a position adjacent the columnar field plate trench.

4. The transistor device of claim 3, wherein in a second area of the first major surface of the semiconductor substrate outside of the one or more first areas, a maximum net dopant concentration of the semiconductor substrate at a position adjacent a side wall of the intersection of the gate trench structure lies within a range of 0.9 times and 1.09 times a maximum net dopant concentration of the semiconductor substrate at a position adjacent the columnar field plate trench.

5. The transistor device of claim 2, wherein the depth of the body region in the region of the intersection is $t_{int}$ and the depth of the body region adjacent the columnar field plate trench is $t_{body}$, wherein the doping level of the body region in the region of the intersection is $D_{int}$ and the doping level of the body region adjacent the columnar field plate trench is $D_{body}$, wherein in the one or more first areas, $t_{int} \geq t_{body}$ and/or $D_{int} > 1.1 D_{body}$, and wherein in a second area of the first major surface of the semiconductor substrate outside of the one or more first areas, $0.95 t_{body} < t_{int} < 1.04 t_{body}$ and/or $0.9 D_{body} < D_{int} < 1.09 D_{body}$.

6. The transistor device of claim 2, wherein the columnar field plate trenches are arranged in a regular array, wherein the first section of the gate trench structure is arranged between adjacent ones of the columnar field plate trenches, wherein the second section of the gate trench structure is arranged between adjacent ones of the columnar plate trenches, wherein the gate trench structure comprises a grid structure formed by a plurality of first sections intersecting a plurality of second sections and forming a plurality of intersections, and wherein the gate electrode has a grid structure.

7. The transistor device of claim 6, wherein:

in the one or more first areas, the body region comprises a higher doping level in a region adjacent the intersection than in a region positioned between neighbouring two intersections; and/or in the one or more first areas, the body region comprises a higher doping level in a region adjacent the intersection than in a region adjacent the columnar field plate trench.

8. A semiconductor package, comprising:

a conductive redistribution substrate comprising a die pad and at least one lead that is spaced apart from the die pad; and the transistor device of claim 1, wherein the transistor device has a second major surface opposing the first major surface and the second major surface is mounted on the die pad, wherein the first contact pad on the first major surface of the transistor device is electrically connected to a lead of the conductive redistribution substrate by a bond wire, wherein the bond wire is bonded to the contact pad at a first position that is located vertically above one of the first areas of the transistor device.

9. The semiconductor package of claim 8, wherein the bond wire is further bonded to the contact pad at a second position by a stitch bond and the second position is located vertically above a further one of the first areas of the transistor device.

10. The semiconductor package of claim 8, wherein the contact pad is a source pad and the first metallization structure on the first major surface further comprises a gate pad that is electrically coupled to a lead of the conductive redistribution substrate, and wherein the second major surface comprises a drain pad that is electrically connected to the die pad.

11. A method of fabricating a transistor device, the method comprising providing a semiconductor substrate comprising a first conductivity type and a first major surface, a plurality of columnar field plate trenches extending into the first major surface, the columnar field trenches each comprising a field plate and a gate trench structure comprising an elongate gate trench having a length, the elongate gate trench extending into the first major surface of the semiconductor substrate and comprising a gate electrode;

implanting dopants of a second conductivity type into the first major surface of the semiconductor substrate to form a body region in the semiconductor substrate, wherein the second conductivity type opposes the first conductivity type;

in a first area of the first major surface only, implanting dopants of the second conductivity type into at least one subregion of the first major surface of the semiconductor substrate within the first area so that at least one of a depth and a doping level of the body region is increased in the at least one subregion and so that at least one of the depth and the doping level of the body region varies laterally within the first area;

implanting dopants of the first conductivity type into the first major surface of the semiconductor substrate and forming a source region on the body region; and forming a metallization structure on the first major surface and that provides a contact pad for wire bonding vertically above the first area.

12. The method of claim 11, further comprising, after implanting the dopants of the second conductivity type into the at least one subregion of the body region, annealing the semiconductor substrate.

13. The method of claim 11, wherein the gate trench structure comprises a first section extending in a first lateral direction and a second section extending in a second lateral direction that is different from the first lateral direction, wherein the second section intersects with the first section at an intersection, wherein in the first area, the at least one subregion is arranged at the intersection.

14. The method of claim 11, wherein the plurality of columnar field plate trenches are arranged in a regular array and the gate trench structure comprises a grid structure formed by a plurality of first sections intersecting a plurality of second sections to form a plurality of intersections, wherein the gate electrode has a grid structure and a pair of first sections and a pair of second sections laterally surround individual ones of the plurality of columnar field plate trenches, wherein within the first area, the at least one subregion is arranged at the intersections so that at least one of the depth and the doping level of the body region varies laterally between the columnar field plate trench and the intersection of the gate trench structure.

15. The method of claim 14, wherein the intersections of the gate trench structure are located in the at least one subregion.

* * * * *